United States Patent
Bauer et al.

(10) Patent No.: US 6,525,387 B2
(45) Date of Patent: Feb. 25, 2003

(54) MULTISPECTRAL PHOTODIODE

(75) Inventors: Andreas Bauer, Hardthausen (DE); Karl-Martin Mahlein, Nordheim (DE); Richard Wollrab, Heilbronn (DE); Johann Ziegler, Untereisesheim (DE)

(73) Assignee: AEG Infrarot-Module GmbH, Heilbronn (DE)

( * ) Notice: Subject to any disclaimer, the term of this patent is extended or adjusted under 35 U.S.C. 154(b) by 0 days.

(21) Appl. No.: 09/899,057

(22) Filed: Jul. 6, 2001

(65) Prior Publication Data
US 2002/0011640 A1 Jan. 31, 2002

(30) Foreign Application Priority Data

Jul. 27, 2000 (DE) .......................................... 100 37 103

(51) Int. Cl.⁷ .............................................. H01L 31/00
(52) U.S. Cl. ...................................... 257/440; 257/461
(58) Field of Search .................... 257/440, 80; 357/12; 250/211 J

(56) References Cited

U.S. PATENT DOCUMENTS

| | | | | |
|---|---|---|---|---|
| 5,146,297 A | * | 9/1992 | Collins et al. ................. | 357/13 |
| 5,149,956 A | * | 9/1992 | Norton ..................... | 250/211 J |
| 5,391,896 A | * | 2/1995 | Wanlass ..................... | 257/80 |
| 6,034,407 A | * | 3/2000 | Tennant et al. ............. | 257/440 |

FOREIGN PATENT DOCUMENTS

| | | |
|---|---|---|
| DE | 3934246 A1 | 4/1991 |
| EP | 0747962 A2 | 12/1996 |
| EP | 0797255 A2 | 9/1997 |
| GB | 2230347 A | * 10/1990 |
| WO | WO 98/49734 | 11/1998 |

* cited by examiner

Primary Examiner—David Nelms
Assistant Examiner—Thinh T. Nguyen
(74) Attorney, Agent, or Firm—Venable; Norman N. Kunitz

(57) ABSTRACT

The present invention relates to a multispectral photodiode for infrared radiation comprising a substrate, a first semiconductor layer of first conductivity with a large band gap arranged on the substrate, a second semiconductor layer of first conductivity with a small band gap arranged on the first semiconductor layer, a first diode area which is formed from a zone of second conductivity with the first semiconductor layer, and a second diode area which is formed from a zone of second conductivity with the second semiconductor layer. The disadvantage of known multispectral photodiodes is that the first diode area, which is sensitive to the short-wave portion, is smaller than the second diode area, which is sensitive to the long-wave portion.

The task of providing a multispectral photodiode, in which the relations of the areas of the first and second diode areas are matched to the relations of the photon flows of the assigned wavelength regions for the temperatures to be considered, is solved by arranging the first diode area concentrically around the second diode area.

9 Claims, 1 Drawing Sheet

MULTISPECTRAL PHOTODIODE

BACKGROUND OF THE INVENTION

The present invention relates to a multispectral photodiode for infrared radiation comprising a substrate having, a first semiconductor layer of a first conductivity type with a large band gap arranged thereon, a second semiconductor layer of the first conductivity type with a small band gap arranged on the first semiconductor layer, a first diode area, formed from a first zone of a second conductivity type with the first semiconductor layer, and a second diode area formed from a second zone of the second conductivity type with the second semiconductor layer.

A multispectral planar photodiode for infrared radiation, which is suitable for arrangement in an array, is known from U.S. Pat. No. 6,034,407. This known photodiode comprises an arrangement of the following semiconductor layers of a first conductivity type: a substrate, upon which is arranged a buffer layer, upon which is arranged a first active layer which is sensitive to a first wavelength range, upon which is arranged a barrier layer, upon which is arranged a second active layer which is sensitive to a second wavelength range, and upon which is arranged a cap layer. A first zone of second conductivity is embedded in the first active layer and forms with this a first diode area. A second zone of second conductivity is embedded in the second active layer and forms with this a second diode area. The zones of second conductivity are also covered by the cap layer, and are contacted through holes by a structured metal film. On the metal film, so-called indium bumps, with which the first and second diode areas can be connected to an external readout circuit, are arranged on corresponding raised points of the photodiode. In this known arrangement, the second diode area is arranged around the first diode area which lies in the center. Whereby the first diode area lies in a trench which extends from the surface through the barrier layer into the first active layer. The photodiode is irradiated from the substrate side. The first active layer has a large band gap, absorbs radiation with a shorter wavelength, and is transparent to longer wavelength radiation. The second active layer has a small band gap, absorbs radiation with the longer wavelength which has not been absorbed while passing through the first active layer.

In the range of infrared radiation at wavelengths of 3–5 $\mu$m (MWIR) and 8–10 $\mu$m (LWIR), the photon flow (at target temperatures around 300 K) quickly reduces as the wavelengths become shorter. However, the known multispectral, planar photodiode has the disadvantage that, because of the relations between the areas of the first and second diode areas, the first diode area, which is sensitive to the short-wave portion, is smaller than the second diode area, which is sensitive to the long-wave portion. However, at the same time, more photons are available in the long-wave range than in the short-wave range. This means that the diode area with a smaller area has to cope with a lower photon flow. This circumstance requires an increased computation effort in automated image processing, which is undesirable, particularly with time-critical applications.

SUMMARY OF THE INVENTION

The object of the invention is therefore to provide a multispectral photodiode, in which the relations of the areas of the first and second diode areas are matched to the relations of the photon flows of the assigned wavelength regions at the temperatures under consideration.

This object of the invention generally is solved according to the invention by a multispectral photodiode for infrared radiation comprising a substrate having a first semiconductor layer of a first conductivity type with a large band gap arranged thereon; a second semiconductor layer of the first conductivity type with a small band gap arranged on the first semiconductor layer; a first diode area, formed from a first zone of a second conductivity with the first semiconductor layer; and a second diode area, which is formed from a second zone of the second conductivity with the second semiconductor layer; and wherein the first diode area is arranged concentrically around the second diode area. Advantageous embodiments of the invention are achieved in accordance with the disclosed features of the invention.

DESCRIPTION OF THE PREFERRED EMBODIMENTS

The invention is explained in the following by means of an embodiment and with the aid of the figures.

Figure 1:
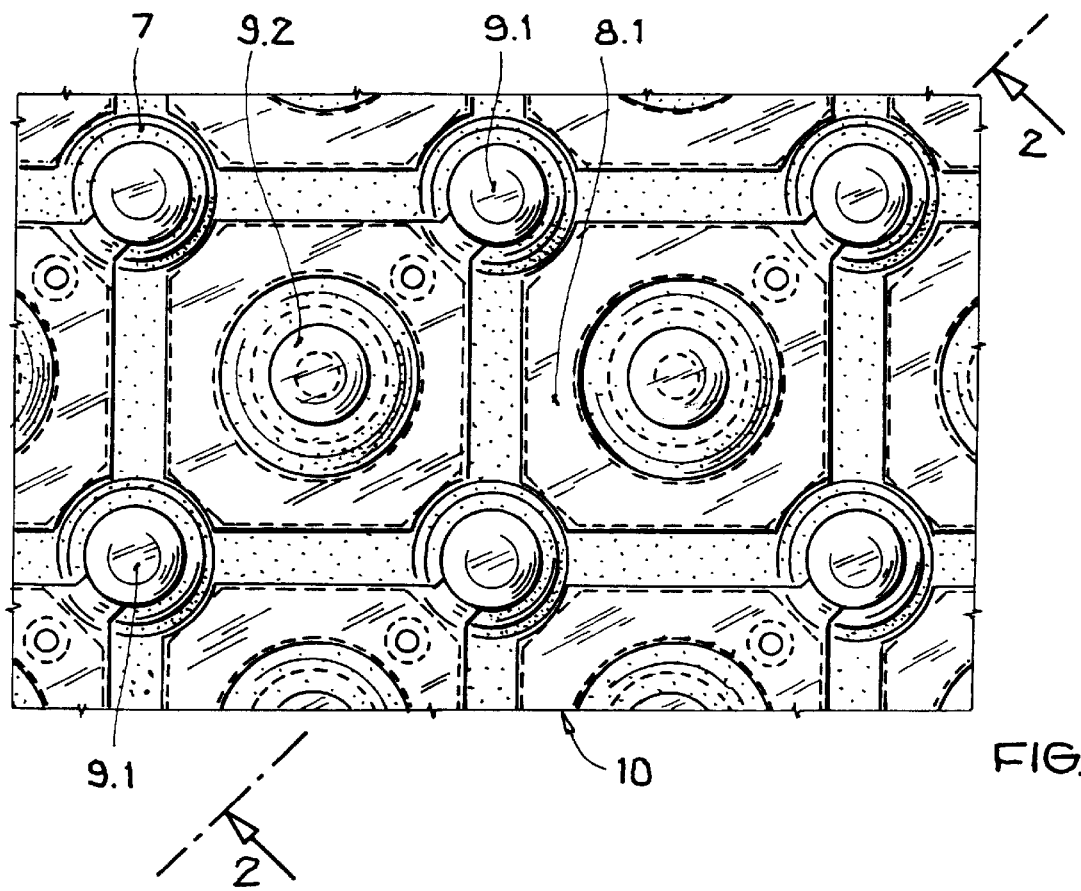
FIG. 1 shows an arrangement of the multispectral photodiodes in a two-dimensional array viewed from above.

The multispectral planar photodiode 1 for infrared radiation, as shown in FIG. 1, is optimally suited to be arranged in an array 10 by means of its particular design. In the present embodiment, a single multispectral photodiode 1 has a substantially rectangular or quadratic base. The diode is connected to an external readout circuit by the solder globules 9.1 and 9.2, which are located at a corner and in the center of the diode.

Figure 2:
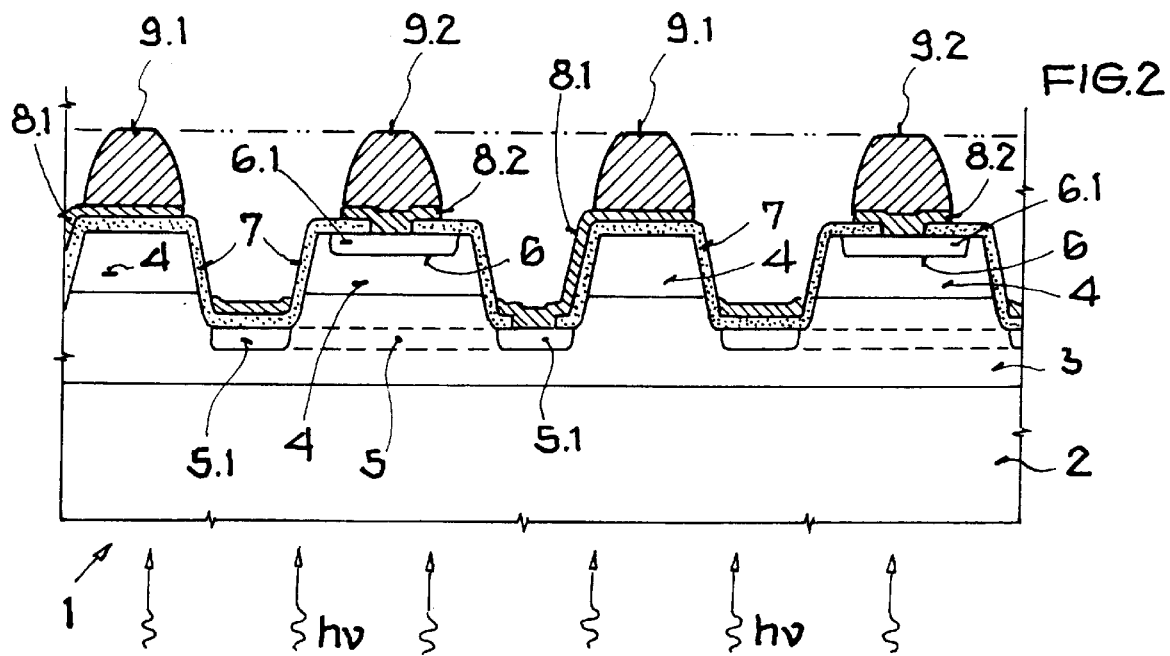
FIG. 2 shows a cross-section along the line 2—2 through the multispectral photodiode according to FIG. 1.

However, the structure of the photodiode will first be described with the aid of FIG. 2.

The multispectral planar photodiode 1 is irradiated from the substrate side 2. The substrate 2 is therefore substantially transparent to the wavelength region of the radiation in consideration. Cadmium-tin-telluride (CdZnTe) has proven itself as a substrate material for infrared detectors in the MWIR 3–5 $\mu$m and LWIR 8–10 $\mu$m spectral regions.

A first semiconductor layer 3 is arranged on the substrate 2. The band gap Egap1 of the first semiconductor layer 3 is selected so that radiation of a first wavelength region is absorbed. In the present embodiment, the first semiconductor layer 3 is p-conducting. Together with a first zone of second conductivity 5.1, which is inserted into the surface of the first semiconductor layer 3, the first semiconductor layer 3 forms a first diode area 5 for detecting radiation in the first wavelength region. However, the first zone of second conductivity 5.1 does not completely cover the first semiconductor layer 3. It is substantially concentrically arranged around a central area.

A second semiconductor layer 4 of the first conductivity type is arranged on the central surface of the first semiconductor layer 3, which is not covered by the first zone of second conductivity 5.1, and on the corner points of the base. The band gap Egap2 of the second semiconductor layer 4 is selected so that radiation of a second wavelength region is absorbed. In addition, the band gaps of the two semiconductor layers 3, 4 are selected so that the first semiconductor layer 3 absorbs none or sufficiently little radiation of the second wavelength region which is to be detected by the second semiconductor layer 4. This usually means that the band gap of the first semiconductor layer Egap1 is greater than the band gap of the second semiconductor layer Egap2.

A second zone of second conductivity 6.1 is inset into the central surface of the second semiconductor layer 4. Together with the second semiconductor layer 4, this forms a second diode area 6 for detecting radiation in the second wavelength region.

The center of a single cell of the array comprises a central elevation which is formed by the second diode area 6. The first diode area 5 is arranged concentrically around the second diode area. It is located substantially on the level of the first semiconductor layer 3. The areas of the two diode areas 5, 6 are matched to each other by suitable dimensioning so that the initially mentioned relations of the sensitivities in the two wavelength regions are attained.

A separate readout circuit, which is not shown in the figures, is provided to readout the two diode areas, said readout circuit is connected to the multispectral photodiode 1 by solder globules 9.1, 9.2, so-called indium bumps. An individual indium bump 9.1, 9.2, which makes the connection from the particular diode area to the evaluation electronics, is provided for each diode area 5,6 of each cell. In order to ensure such a connection, it is necessary for all indium bumps 9.1, 9.2 to be arranged substantially in one plane on the multispectral photodiode. In order to achieve this, second elevations over which the first diode areas 5 are contacted, are provided in each cell apart from the central elevations of the second diode areas 6.

The contact for the first diode area 5 is advantageously arranged at one of the corners of the cells so that, in the arrangement in the array, one contact for a first diode area 5 is arranged at each of the four corners of a cell, as shown in FIG. 1. Whereby three of them belong to adjacent cells. The contact for the second diode area 6 is located in the center of the cell. As all elevations are created in the same process step and substantially consist of the second semiconductor layer 4, they have the same height and can be easily connected to the readout circuit by means of the indium bumps 9.1, 9.2.

The surface of the multispectral photodiode 1 is completely covered by a passivating layer 7. The passivation 7 has holes, so-called vias, through which the metalizing 8.1, 8.2 arranged on the passivating layer 7 contacts the zones of second conductivity—n-conductivity type in the embodiment. The metalizing 8.1, 8.2 is structured in such a manner that the greatest possible areas of the photodiodes are covered by the metalizing. By so doing, radiation, which is not absorbed by the semiconductor layers 3, 4 is reflected by the metalizing 8.1, 8.2 back into the semiconductor layers, thus increasing the quantum yield. The photodiode 1 has metalizing 8.1, 8.2 in two significant areas. The first area 8.1, separated by the passivating layer 7, is located on the first diode area 5 and leads to the elevation assigned to the first diode area 5. A solder globule 9.1 is arranged on the elevation. The second area of metalizing 8.2 is located above the second diode area 6. A further solder globule 9.2 is arranged on that.

So that a photodiode—in particular a photodiode assigned to one pixel in an array—sees the same scene simultaneously in both colors, it is necessary for the zones in which the two diode areas 5, 6 collect photons within the scope of the resolution of the optic to overlap. This is achieved in the photodiode according to the invention, in which the first diode area 5 concentrically surrounds the second diode area 6.

It is particularly advantageous for the area of the first diode area 5, which responds to the short-wave portion of the radiation, to be larger than the area of the second diode area 6, which responds to the long-wave portion of the radiation. These relations of the areas are matched to the photon flows actually occurring at target temperatures of around 300 K. A larger area of the diode area, that is a larger detector surface, and thus also an improved sensitivity is available for the short-wave region of the radiation, in which the photon flow is low.

What is claimed is:

1. Multispectral photodiode (1) for infrared radiation comprising:
    a substrate (2)
    a first semiconductor layer (3) of first conductivity with a large band gap arranged on the substrate (2)
    a second semiconductor layer (4) of first conductivity with a small band gap arranged on the first semiconductor layer (3)
    a first diode area (5), which is formed from a first zone of second conductivity (5.1) with the first semiconductor layer (3)
    a second diode area (6), which is formed from a second zone of second conductivity (6.1) with the second semiconductor layer (4) wherein
    the first diode area (5) is arranged concentrically around the second diode area (6).

2. Multispectral photodiode according to claim 1 wherein the area of the first diode area (5) is larger than the area of the second diode area (6).

3. Multispectral photodiode according to claim 1 wherein solder globules (9.1, 9.2) are provided for contacting the first and second diode areas (5, 6).

4. Multispectral photodiode according to claim 3 wherein the solder globules (9.1, 9.2) are arranged on elevations so that they lie in one plane.

5. Multispectral photodiode according to claim 4 wherein a multitude of photodiodes (1) are arranged in a two-dimensional array (10).

6. Multispectral photodiode according to claim 2 wherein solder globules (9.1, 9.2) are provided for contacting the first and second diode areas (5, 6).

7. Multispectral photodiode according to claim 6 wherein the solder globules (9.1, 9.2) are arranged on elevations so that they lie in one plane.

8. Multispectral photodiode according to claim 7 wherein a multitude of photodiodes (1) are arranged in a two-dimensional array (10).

9. Multispectral photodiode according to claim 1 wherein a multitude of photodiodes (1) are arranged in a two-dimensional array (10).

* * * * *